US007336145B1

(12) United States Patent
Zelinski et al.

(10) Patent No.: US 7,336,145 B1
(45) Date of Patent: Feb. 26, 2008

(54) METHOD FOR DESIGNING RF EXCITATION PULSES IN MAGNETIC RESONANCE TOMOGRAPHY

(75) Inventors: Adam Charles Zelinski, Cambridge, MA (US); Elfar Adalsteinsson, Belmont, MA (US); Kawin Setsompop, Cambridge, MA (US); Lawrence L. Waid, Cambridge, MA (US); Joerg Ulrich Fontius, Neunkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/599,905

(22) Filed: Nov. 15, 2006

(51) Int. Cl.
*G01V 3/00* (2006.01)
(52) U.S. Cl. ...................... 334/309; 324/307
(58) Field of Classification Search ........ 324/300–322; 600/407–445
See application file for complete search history.

(56) References Cited

U.S. PATENT DOCUMENTS

| 4,922,465 | A * | 5/1990 | Pieprzak et al. | 367/38 |
| 5,729,451 | A * | 3/1998 | Gibbs et al. | 702/12 |
| 6,904,305 | B2 * | 6/2005 | Tsekos | 600/417 |
| 2005/0204329 | A1 * | 9/2005 | Pauca et al. | 716/21 |
| 2006/0074908 | A1 * | 4/2006 | Selvaraj et al. | 707/6 |

* cited by examiner

*Primary Examiner*—Brij B. Shrivastav
(74) *Attorney, Agent, or Firm*—Schiff Hardin LLP

(57) ABSTRACT

Waveforms for radio-frequency (RF) excitations pulses used in magnetic resonance imaging are designed according to a Least Squares QR (LSQR) algorithm or a Conjugate Gradient Least Squares (CGLS) algorithm, to solve the linear system of equations that arises in a multi-channel RF transmit arrangement. Better management of SAR and other factors is achieved with RF pulses designed according to these algorithms, compared to the conventionally employed singular value decomposition (SVD) algorithm.

18 Claims, 7 Drawing Sheets

REGION 0
REGION 1
REGION 2
REGION 3

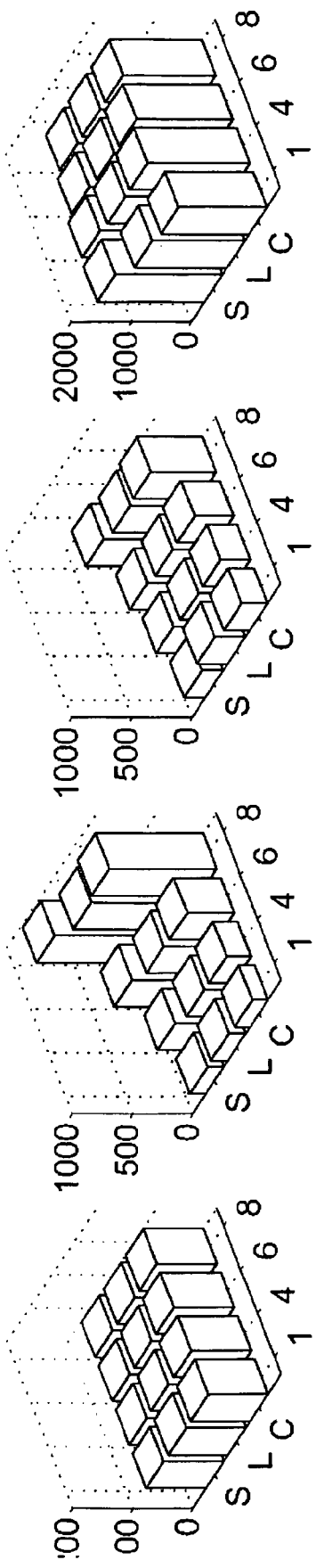

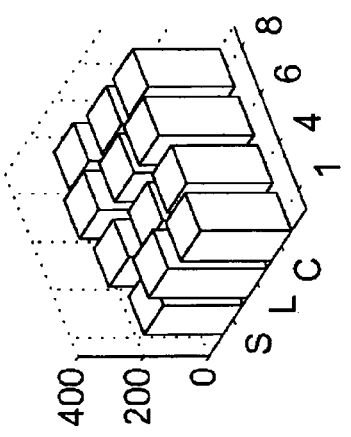
FIG. 9A Noise Region 0
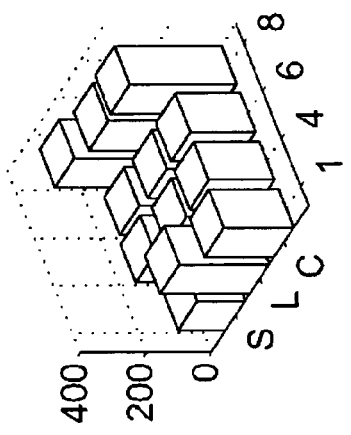
FIG. 9B Edge Region 1
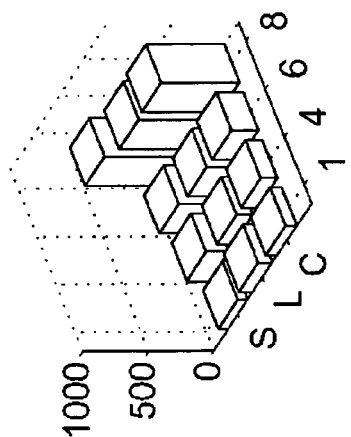
FIG. 9C Background Region 2
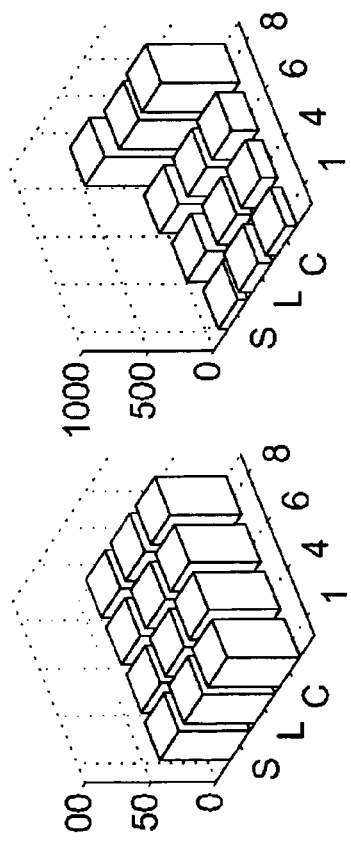
FIG. 9D Letters Region 3

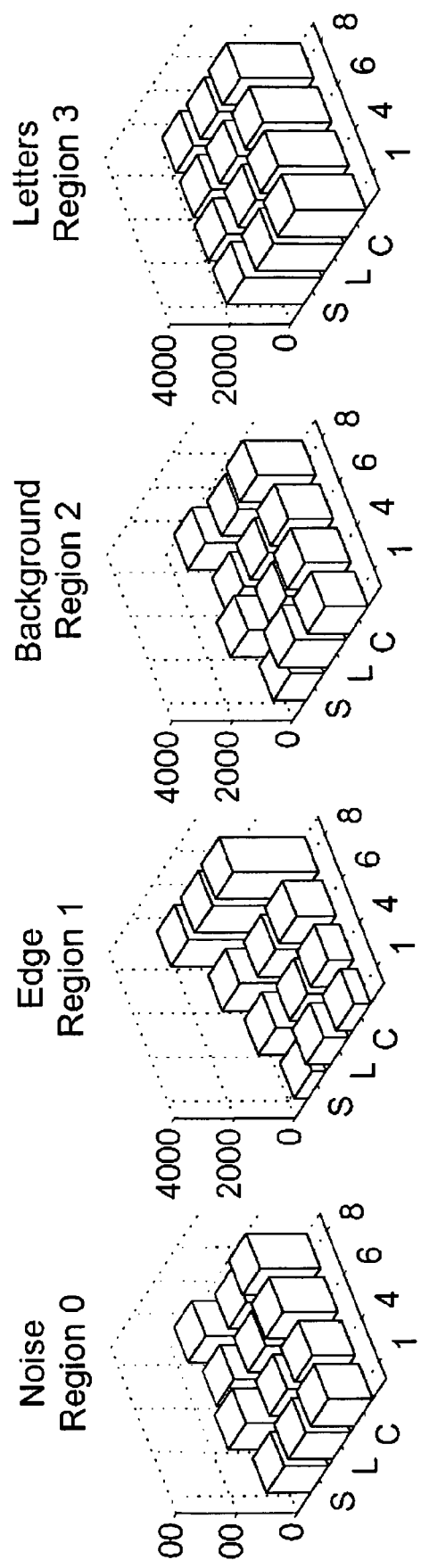

METHOD FOR DESIGNING RF EXCITATION PULSES IN MAGNETIC RESONANCE TOMOGRAPHY

FEDERAL FUNDING LEGEND

This invention was produced in part using funds from the Federal government from National Institutes of Health P41RR14075, United States Department of Defense (National Defense Science and Engineering Graduate Fellowship), R. J. Shillman Career Development Award. Accordingly, the Federal government has certain rights in this invention.

BACKGROUND OF THE INVENTION

1. Field of the Invention

The present invention relates to a method for designing waveforms of RF pulses for use in an excitation sequence in magnetic resonance tomography.

2. Description of the Prior Art

Currently clinical magnetic resonance (MR) systems use a single RF transmitting channel for emitting radio-frequency pulses to excite nuclear spins in an examination subject. The use of a single RF transmit channel imposes limitations in several applications of MR imaging, such as high-field and whole body imaging.

The use of multiple, independent RF modulators and RF coils is the subject of current investigation, and holds promise for mitigating some of the limitations imposed by the use of single RF transmit channel, by providing additional degrees of freedom.

A significant concern associated with multi-channel transmission is a potentially higher specific absorption (SAR), due to the larger number of simultaneously transmitting channels.

When RF pulses are designed using a conventional matrix inversion by means of a singular value decomposition (SVD), this results in a higher RF peak and RMS power than is necessary to achieve excitation within specified designed constraints. Therefore, SAR and pulse power (peak and RMS) ca, in theory, be reduced without a comprise in excitation quality.

Some of the many negative consequences of high SAR are that the flip angle cannot be set to the desired value, which degrades the signal-to-noise ratio (SNR) and image contrast, the SAR online supervision switches off the RF power during the measurement, thereby delaying or stopping the scan, artificial limits are imposed on the number of achievable slices, and an increase in repetition time (TR) is required, which translates into longer scan times.

Furthermore, conventional RF design algorithms lead to higher artifact levels in images due to their poor numerical properties. For example, images may exhibit incomplete background suppression, poor spin cancellation, or suboptimal excitation of desired target regions.

Parallel RF excitation in the presence of 2-D and 3-D gradient trajectories offers a flexible means for spatially-tailoring excitation patterns for inner-volume excitation (J. Pauly, et al. A k-space analysis of small-tip angle excitation. *J. Magn. Reson. Med.*, 81:43-56, 1989) and to address increased $B_1$-inhomogeneity observed at high field strengths due to wavelength interference effects as described in V. A. Stenger et al. B1 Inhomogeneity Reduction with Transmit SENSE. *2nd International Workshop on Parallel Imaging*, page 94, 2004. Zurich, Switzerland. Small tip angle three-dimensional tailored radiofrequency slab-select pulse for reduced B1 inhomogeneity at 3 T (*J. Magn. Reson. Med.*, 53(2):479-484, 2005, and J. Ulloa and J. V. Hajnal. Exploring 3D RF shimming for slice selective imaging. *ISMRM*, page 21, 2005. Miami Beach, Fla., USA). These pulses are useful because they may be tailored to impose an arbitrary spatial pattern on the transverse magnetization's magnitude and phase, subject to the constraints on RF and gradient hardware. The implementation of a 3-channel parallel excitation system was first shown by Ullmann et al. in Experimental analysis of parallel excitation using dedicated coil setups and simultaneous RF transmission on multiple channels. *J. Magn. Reson. Med.*, 54(4):994-1001, 2005. More recently, researchers designed an 8-channel parallel excitation system on a 3T human scanner, demonstrating fast slice-selective uniform excitation and high resolution 2-D spatial shape excitation A parallel excitation system consists of a set of coil arrays capable of independent, simultaneous RF transmission. Assuming that the set of gradient waveforms is fixed (i.e., the k-space trajectory is pre-determined), the $B_1$ maps of the coil arrays are known, and that a desired complex-valued target excitation pattern is chosen, it remains necessary to design a set of RF waveforms for the coil array to perform the specified spatially-tailored excitation. The primary limitation of such an excitation is the length of time needed for the pulse. A parallel excitation system circumvents this limitation by allowing one "accelerate" the k-space trajectory via undersampling, which leads to a reduction in RF pulse duration. An acceleration factor of R for a spiral trajectory means that the radial separation between spiral samples is increased by a factor of R relative to the unaccelerated Nyquist-sampled design. This acceleration is possible due to the extra degrees of freedom introduced by the system's multiple excitation coil arrays, analogous to acceleration in parallel reception.

Due to their complexity and nonlinearity, the equations relating the RF waveforms and target excitation are fast linearized using Grissom et al.'s formulation (W A. Grissom, et al. A new method for the design of RF pulses in Transmit SENSE. *2nd International Workshop on Parallel Imaging*, page 95, 2004. Zurich, Switzerland), which is essentially the application of the ubiquitous small-tip angle approximation to parallel systems, as noted in the aforementioned article by Pauly et al. Other valid approaches to solving this system have been presented by Katscher et al., Transmit SENSE. *J. Magn. Reson. Med.*, 49(1):144-150, 2003, who solve the system in k-space, and Zhu et al. Parallel excitation on an eight transmit channel MRI system. *ISMRM*, page 14, 2005. Miami Beach, Fla., USA, who formulate the problem in the spatial domain assuming an echo-planar k-space trajectory. All of these formulations greatly simplify the design process by reducing the design problem to solving a linear system equations. After linearizing the parallel RF equations, each of the three RF waveform design methods is used to design RF pulses. Each of the techniques is a different way of solving the system of equations and, because of finite-precision effects, yields a different set of RF waveforms. Each set of waveforms, in turn, leads to a unique excitation pattern and hence different excitation artifacts.

The conventionally employed algorithm used in MR technology makes use of an approximate pseudo-inverse generated by a singular value decomposition (SVD). This is popular for least-squares problems in many application areas and easy to justify analytically as discussed in G. H. Golub et al. *Matrix Computations*. Johns Hopkins University Press, 1983 and G. Strang. *Introduction to linear Algebra*. Wellesley-Cambridge Press, 1993. This will be referred to herein as the "SVD-based method".

SUMMARY OF THE INVENTION

An object of the present invention is to provide a method for designing waveforms of radio-frequency pulses for a magnetic resonance imaging employing parallel RF excitation via multiple channels, which produces better results than the conventional SVD-based methods.

The above object is achieved in accordance with the present invention in a method fro generating a radio-frequency pulse waveform for a magnetic resonance imaging sequence operating with parallel RF excitation, wherein the resulting linear equation system is solved either by a Least Squares QR (LSQR) algorithm or a Conjugate Gradient Least Squares (CGLS) algorithm.

The Least-Squares QR (LSQR) and Conjugate Gradient Least-Squares (CGLS) algorithms, are more recent developments that are specifically tailored to solve large linear systems and have favorable numerical properties (C. C. Paige et al. LSQR: An algorithm for sparse linear equations and sparse least squares. *ACM Transactions on Mathematical Software*, 8(1):43-71, March 1982; Paige et al. Algorithm 583: LSQR: Sparse linear equations and least-squares problems. *ACM Transactions on Mathematical Software*, 8(2):195-209, 1982, C. C. Paige and M. A. Saunders. LSQR: Sparse Equations and Least Squares. Online http://www-.stanford.edu/group/SOL/software/lsgr.html, and Paige et al. CGLS: CG method for Ax=b and Least Squares. Online: http://www.stanford.edu/group/SOL/software/cgls.html. These two algorithms have seen relatively little use in more application-oriented fields such as MRI.

Using LSQR or CGLS to solve a linearized system of parallel RF design equations results in better excitations— both qualitatively and quantitatively—than those yielded via the traditional SVD-based method. This holds whenever the acceleration factor of the k-space trajectory is greater than one. In addition to improved artifact levels, the LSQR and CGLS designs use significantly lower peak and RMS voltage compared to SVD-based designs.

DESCRIPTION OF THE DRAWINGS

FIGS. 8A, 8B, 8C and 8D respectively graphically illustrate the means in the different regions of the images respectively generated using RF waveforms designed according to SVD, LSQR and CGLS algorithms.

FIGS. 9A, 9B, 9C and 9D respectively graphically illustrate the standard deviations in the different regions of the images respectively generated using RF waveforms designed according to SVD, LSQR and CGLS algorithms.

FIGS. 10A, 10B, 10C and 10D respectively graphically illustrate the peak values in the different regions of the images respectively generated using RF waveforms designed according to SVD, LSQR and CGLS algorithms.

DESCRIPTION OF THE PREFERRED EMBODIMENTS

Figure 1:
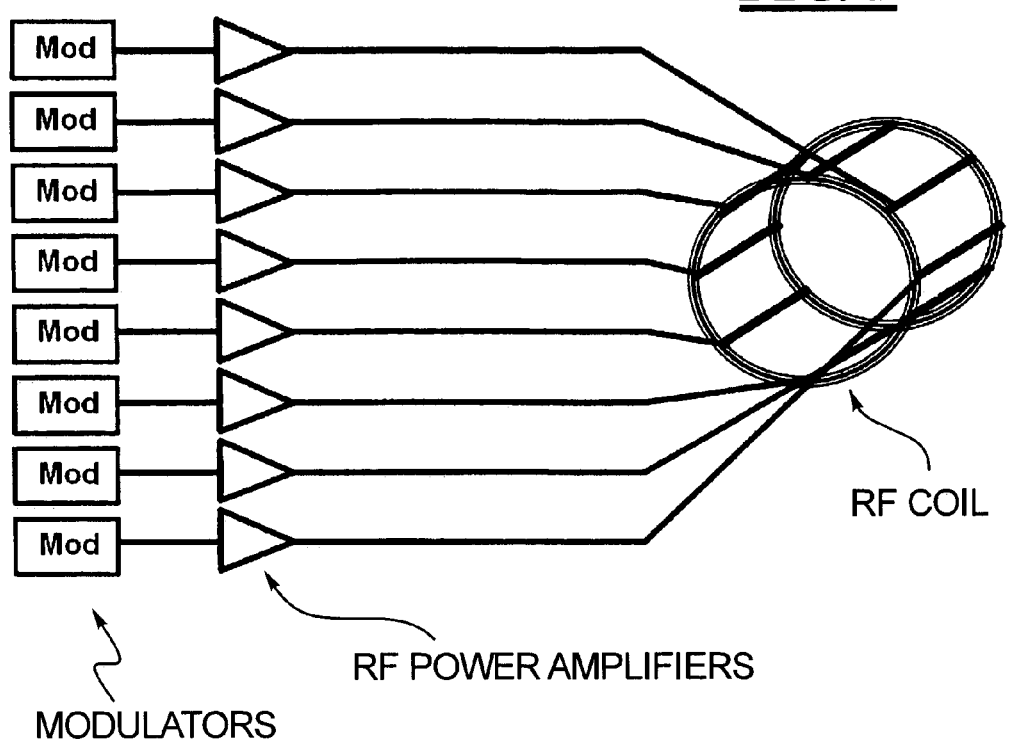
FIG. 1 schematically illustrates a multi-channel RF transmission arrangement for a magnetic resonance imaging system.

First, parallel excitation RF waveform design is discussed, followed by a discussion of three algorithms for (approximately) solving a linear system of equations.

The equations describing the interaction between the RF waveforms played along each coil array and the resulting excitation pattern are nonlinear and complicated. Thus, it is desirable to reduce the system of equations in some manner to simplify the overall RF design process.

Grissom et al. simplify RF design for parallel systems by first applying a parallel small-tip angle approximation to the original set of equations and then discretizing the result in the spatial and temporal dimensions [3]. The use of the small-tip angle approximation is greatly beneficial because it reduces the RF design problem from a set of nonlinear equations to a set of linear ones that contains a Fourier transform. The linearized excitation due to P coils is written as follows:

$$m(r) = i\gamma \sum_{p=1}^{P} S_p(r) \int_0^T B_{1,p}(t) e^{ir\cdot k(t)} dt, \quad (1)$$

where r is a multi-dimensional spatial variable, m(r) the approximate transverse magnetization after excitation, γ the gyromagnetic ratio. $S_p(r)$ the spatial sensitivity profile of the pth coil, $B_{1,p}(t)$ the RF waveform played along the pth coil, and T the duration of each RF waveform. Finally, k(t) is the excitation k-space trajectory, defined as follows:

$$k(t) = -\gamma \int_t^T G(\tau) d\tau, \quad (2)$$

where G(t) is the (multi-dimensional) gradient waveform, also of duration T.

Discretizing equation (1) along its spatial and temporal dimensions reduces it to a familiar linear system:

$$m = Ab, \quad (3)$$

where m is an M×1 vector yielded by lexicographically ordering the discretized elements of the transverse magnetization pattern m(r), b is a voltage vector representing the P sampled RF waveforms and A is an M×N matrix that simultaneously incorporates information about the discretized coil profiles and the Fourier-to-space nature of the particular k-space trajectory being traversed. M is equal to the number of spatial locations at which the coil profiles and magnetization profile are sampled, and N equals P times the number of time samples in each individual RF waveform, $B_{1,p}(t)$ Thus, A may be quite large in size if the coil profiles, magnetization profile or RF waveforms are finely sampled.

Choosing a transverse magnetization target profile and a k-space trajectory, as well as a discretization scheme for both, implicitly determines m and A. What remains is to find a candidate vector b that (approximately) solves the system of equations m=Ab. Once b is determined, each of the P sampled RF waveforms may be extracted from it, played through a simulation or actual system, and an image due to this excitation recorded. If the small-tip angle approximation indeed holds and the signal-to-noise ratio (SNR) of the acquisition is sufficiently large, then this observed excitation resembles the target magnetization profile.

It is worth noting that during the RF waveform design stage, RF pulses are shortened by exploiting variations among the spatial excitation profiles of the coil array elements. Thus, for a given target excitation, T may be smaller for parallel systems. This is due to the extra spatial degrees of freedom present when P>1.

One may solve the system of equations described by (3) using a truncated pseudo-inverse generated via a singular value decomposition (SVD). This is a conventional and well-known approach to solving a large linear system.

One way to estimate the unknown vector b is to seek an estimate $\hat{b}$ based on the principle of least-squares by minimizing $\|m-Ab\|_2$, where $\|x\|_2$ is the $l_2$-norm of the vector x, i.e., $(\Sigma_{i=1}^{M} x_i^2)^{1/2}$. It is well known that one may use the Moore-Penrose pseudo-inverse of A, denoted by $A^\dagger$ to find a solution $\hat{b}=A^\dagger m$. The most common way of generating $A^\dagger$ is through a singular value decomposition of the M×N matrix A into $U\Sigma V^H$, where U and V are unitary M×M and N×N eigenvector matrices of $AA^H$ and $A^H A$, respectively, and $A^H$ indicates the Hermetian transpose of A. If A is of rank $J \leq \min(M, N)$, then $\Sigma$ is an M×N diagonal matrix whose diagonal elements $\sigma_1 \geq \sigma_2 \ldots \geq \sigma_J > 0$ are the nonzero singular values of A, and $A^\dagger$ may be computed as follows:

$$A^\dagger = V \Sigma^+ U^H = \sum_{j=1}^{J} \frac{1}{\sigma_j} v_j u_j^H, \qquad (4)$$

where $u_j$ and $v_j$ are the jth columns of U and V, respectively, and $\Sigma^+$ is implicitly defined by the above expression.

When A is ill conditioned, $A^\dagger$ yields a poor candidate for b. This is because equation (4) uses all of A's nonzero singular values, even those that only represent its noise subspace. By throwing away some of the smaller-valued, higher-order singular values and retaining only the first K<J of them, a better-conditioned approximate or truncated pseudo-inverse of A is obtained as follows:

$$A_K^\dagger = \sum_{k=1}^{K} \frac{1}{\sigma_k} v_k u_k^H, \qquad (5)$$

and one may subsequently obtain a better estimate $$\hat{b}_k = A_K^\dagger m \cdots$$

The lone control parameter of this algorithm is K, the number of singular values retained when forming the truncated pseudo-inverse. As K increases, the $l_2$-error $\|m-Ab_K\|_2$ decreases whereas the energy of the solution vector, $\|b_K\|_2$, increases.

For large matrices, this algorithm runs slowly because it needs to compute the SVD of A, which is a time-consuming, memory-intensive task. For a fixed value of K, there do indeed exist faster methods that compute a truncated pseudoinverse $$A_K^\dagger$$

(generating truncated versions of U, V and $\Sigma$ corresponding only to the K largest singular values). However, one is typically forced to compute the entire SVD and analyze all J singular values in order to make an informed decision about K, the number of values one ultimately retains.

In addition to the SVD-based method, there are many other ways to (approximately) solve linear systems of equations. As noted above, two algorithms, Least-Squares QR ("LSQR") and Conjugate Gradient least-Squares ("CGLS"), have been developed. Each of these algorithms regularizes and then solves a linear system of equations in a particular manner. The algorithms are described in more detail below.

"QR' is a well-known matrix decomposition that LSQR relies upon to solve least-squares problems, hence the name LSQR. Its purpose is to solve sparse, large linear least-squares problems in a fast, numerically attractive manner. The algorithm has one primary control parameter, d, which is essentially a damping term, and a set of secondary control parameters that allow the user to set the maximal number of iterations, the solution vector's precision, etc. Specifically, LSQR solves the following optimization problem:

$$\min_b \|m - Ab\|_2 + d^2 \|b\|_2. \qquad (6)$$

In some fields, (6) is known as a Tikhonov regularization and d is referred to as the Tikhonov factor. As d increases, more weight is placed on the $l_2$-norm of b than on the residual error, which causes $\|b\|_2$ to decrease and $\|m-Ab\|_2$ to increase.

Traditionally, (6) is implemented by solving the normal equations $(A^H A + d^2 I)b = A^H m$ via a symmetric conjugate gradient method. Instead, Paige and Saunders propose a conjugate-gradient descent method based on the Golub-Kahan bi-diagonalization process. This latter approach is algebraically equivalent to the former but has better numerical properties and is optimized for both speed and ill-conditioned A matrices. The algorithm is quite versatile, accepting an A of any size or rank.

Conjugate Gradient Least-Squares (CGLS) algorithm is a newer algorithm that makes use of a conjugate gradient (CG) method to solve a least-squares problem. Specifically, it solves the following optimization:

$$\min_b \|(A^H A + sI)b - A^H m\|_2, \qquad (7)$$

where s is the main control variable, also called the shift parameter. Similarly to LSQR's Tikhonov factor, as s increases, the $l_2$-norm of b decreases whereas the residual error increases. The method is guaranteed to be stable for all $s \geq 0$ and has a variety of secondary control parameters, one of which allows the user to limit the program's number of iterations. Rather than using a symmetric conjugate gradient method on the normal equations in (7), CGLS uses a different technique optimized for large systems of unsymmetrical linear equations. CGLS is somewhat more complicated to use than LSQR.

Yip et al. have recently used an iterative CG algorithm to solve a quadratic optimization to design multi-dimensional RF pulses in k-space (C. Y. Yip et al. Iterative RF pulse design for multidimensional, small-tip-angle selective excitation. *J. Magn. Reson. Med.*, 54(4):908-917, October 2005.) Furthermore, CG-based algorithms were popularized a half decade ago by Pruessmann and Kannengießer for the iterative reconstruction of SENSE data (Pruessmann et al. A gridding approach for sensitivity encoding with arbitrary trajectories. *ISMRM*, page 276, 2000; Kannengießer et al. Accelerated image reconstruction for sensitivity encoded imaging with arbitrary k-space trajectories. *ISMRM*, page 155, 2000; Pruessmann et al. Advances in sensitivity encoding with arbitrary k-space trajectories. *J. Magn. Reson. Med.*, 46:638-651, 2001.).

When A and m are fixed, LSQR and CGLS compute b much faster than the SVD-based method. This is because LSQR and CGLS avoid using an SVD, which is a costly decomposition in terms of memory usage and computation time. For example, for one of our RF waveform design experiments conducted in MATLAB on a 2.8 GHz Pentium IV Xeon processor, where A was 1466×3872 in size and m contained 1466 elements, the SVD-based algorithm had a runtime of 4.9 minutes whereas LSQR and CGLS each finished in less than 10 seconds.

For image quality evaluation, a variety of metrics used to quantify an excitation image's artifacts are discussed followed by the experiment used to compare the three design methods, followed by a description of the 8-channel parallel excitation system operating according to the invention.

One way of evaluating how well an observed image O(x, y) matches a target image T(x, y) is to quantify how "close" the former is to the latter using some metric. A second way of evaluating an observed image's quality is to quantify its artifacts. Both of these approaches allow one to gauge the quality of the observed image. Below, we describe three quantitative metrics that are useful for evaluating the quality of an observed image.

The correlation coefficient between an observed image and the intended target image quantifies the similarity between the images with a single scalar value, $C \in [-1,1]$. It is defined as follows:

$$C(O, T) = \frac{Cov(O, T)}{\sigma_O \sigma_T}, \quad (8)$$

where Cov(O,T) is the covariance between the observed and target image calculated within a particular spatial region, and $\sigma_O$, $\sigma_T$ are the variances of images O and T, respectively, taken over this same spatial region. A value of C close to 1 indicates that the images are quite similar, whereas a C close to 0 indicates that they are completely unrelated from a statistical standpoint.

Computing the observed image's second-order statistics (throughout the whole image or across different regions) allows one to judge the amount of artifacts and noise present in the image. This involves calculating the mean, $\mu$, and standard deviation, $\sigma$. If the target image is uniform in a certain region, the observed image's $\sigma$ across this same region indicates the amount of artifacts or noise present—the smaller $\sigma$, the better the observed image matches up to the target.

The maximum value in the observed image (or within a region of the observed image) provides information about the worst-case artifact or noise level that is present. Given two equally noisy observations of the same target image, much larger peak values in one indicate that it has more artifacts than the other.

These experiments performed to compare the different RF waveform design methods are now described. It is assumed that both the RF design algorithm and the acceleration factor of the spiral, R, are fixed, and that all coil profiles are deterministic and known.

Figure 2:
FIG. 2 shows a target image serving as the starting image for the experimental investigations described herein.

The chosen target image is a 51×51 pixel Massachusetts Institute of Technology (MIT) logo with a resolution of 4-mm in each dimension, depicted in FIG. 2. As indicated by the shading, there are two nonzero intensity levels the image: the lower part of the letter "i" is twice as intense as the other letters.

To form a 2-D excitation, the excitation k-space is traversed with a 2-D spiral as described by B. Hargreaves. Variable-Density Spiral Design Functions. Online. http://www-mrsri.stanford.edu/brian/vdspiral/. The spirals are configured such that the resulting image resolution is 4-mm with a field-of-view (FOV) equal to 18 cm with an acceleration factor equal to R.

Once R is chosen, the k-space trajectory is completely determined. For the gradient amplitude of 35 mT/m and slew rate of 150 T/m/s used in our experiments, the duration of the unaccelerated (R=1) trajectory is 9.47 milliseconds (ms), and for R=4, 6 and 8, the times are 2.42 ms, 1.64 ms, and 1.26 ms, respectively.

The target image and k-space trajectory (for a fixed value of R) are deterministic. Based on the discussion of Grissom's formulation above and using the same notation, this determines the vector m and the matrix A. To complete the RF design, what remains is to find the RF waveform vector, b, by running the chosen design method (the SVD-based algorithm, LSQR or CGLS).

Suppose b is determined, and thus the set of RF waveforms, using some arbitrary method. It is now necessary to simulate the RF waveforms to see how well they generate the target logo. The excitation images are simulated by using a spin-domain representation of the Cayley-Klein parameters and discretizing the Bloch equation in time.

For a fixed value of R, Grissom et al.'s formulation is applied to yield m and A. Then the linearized system is solved using one of the three design algorithms, yielding a vector b. The parameter(s) available is/are tuned to the chosen algorithm such that the mean of the region corresponding to the unit intensity area of the target image equals some constant. This ensures that when the other two algorithms are used to design their own versions of the b vector, the observed images resulting from each of the three methods will be of similar intensities and will be fairly comparable.

Running each design algorithm yields three different RF designs. For a fixed choice of R, the algorithms' parameters are tuned as discussed above. The RF waveforms designed by each method are then played through an actual 8-channel parallel excitation system implemented on a 3T human scanner (whose configuration is discussed in the next subsection) and the excitation patterns generated by each method are imaged and stored as a set of 2-D magnitude images (i.e., intensity maps) using the Digital Imaging and Communication in Medicine (DICOM) format. Each is 128×128 pixels with a 2-mm in-plane resolution. These three images are then analyzed and compared using the image quality metrics discussed earlier.

Figure 3:
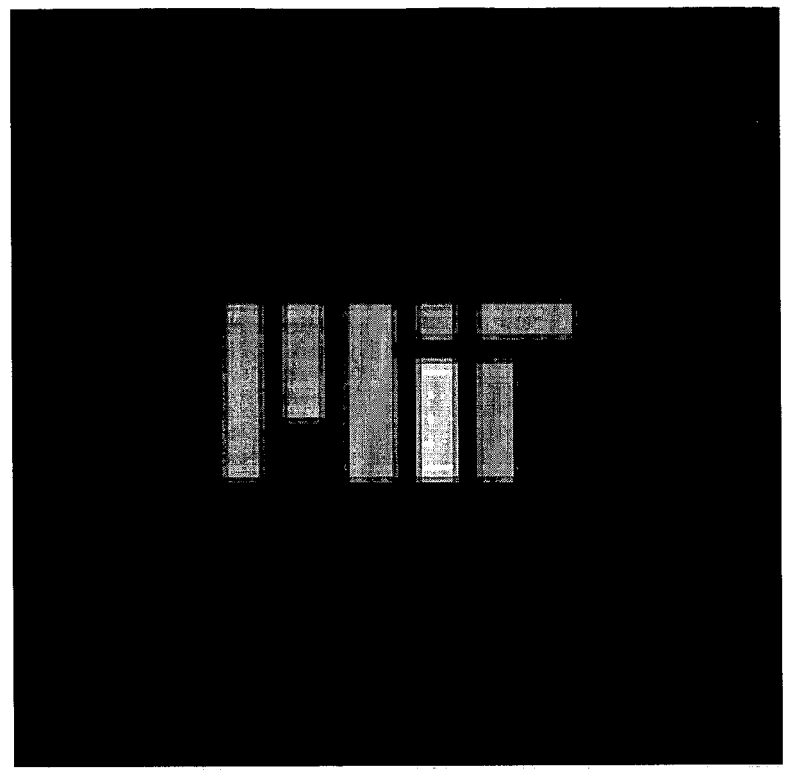
FIG. 3 shows a target image generated with an image registration algorithm used for comparing images respectively generated with RF pulses designed according an SVD-based algorithm, an LSQR algorithm and a CGLS algorithm.

To compare the 51×51 pixel, 4-mm in-plane resolution target with sampled images that are 128×128 pixels in size with a 2-mm resolution, the target image's resolution is doubled (via Fourier zero-padding) and the original target is shifted by a sub-pixel amount to maximize the overlap between the target and observed images. The optimal shift maximizes the correlation coefficient of the increased resolution image with the sum of the observed images. The 128×128 pixel, 2-mm resolution target image generated by this image registration algorithm is depicted in FIG. 3. It now has a continuum of nonzero intensity levels rather than only two, which is simply a consequence of changing the resolution via sinc-interpolation. It is this target image that is used for all subsequent correlation coefficient computations.

Figure 4:
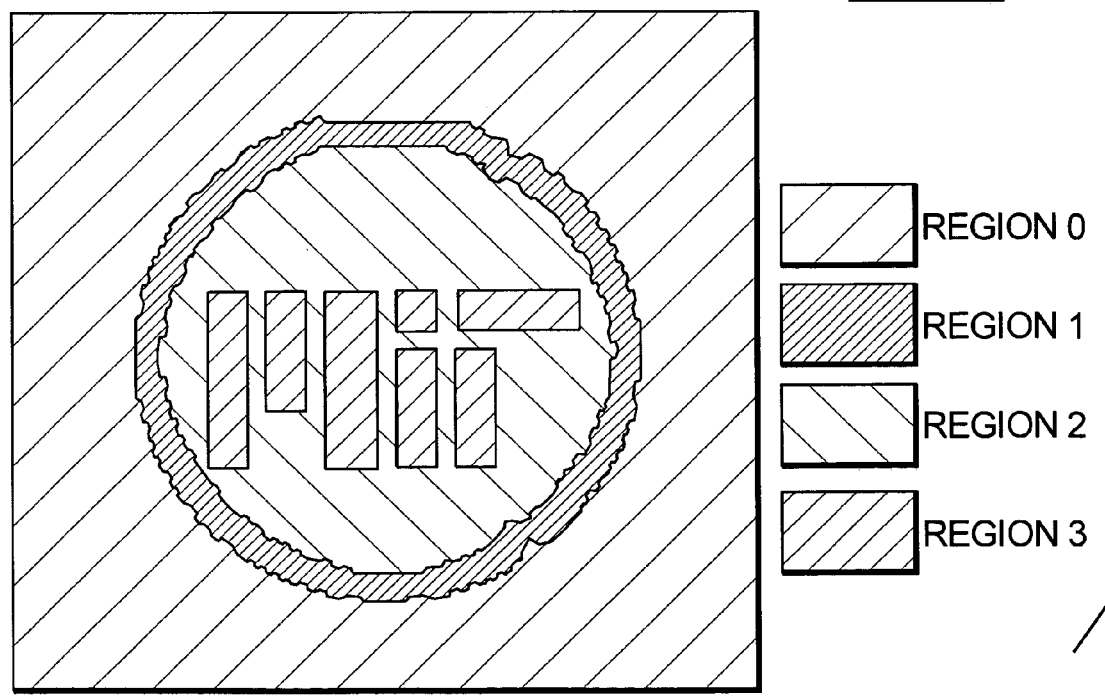
FIG. 4 schematically illustrates the regions of the experimental images that have been designated for comparison purposes.

The second-order statistics and peak values of each observed image are calculated by first segmenting the image into four regions and then computing the statistics on a region-by-region basis. FIG. 4 illustrates the chosen set of regions. Breaking the image into four distinct regions is done in a logical way as follows: Region 0 is where only true statistical noise is present, outside the influence of any excitation coil. Region 1 is an estimate of the ring-like edge region where the most glaring artifacts tend to occur. Region 2 is the suppression region, where the coil profiles are interacting and should cancel out, but do not always do so perfectly. Region 3 corresponds to the letters of the target image. The first three regions are generated by applying empirically determined thresholds to the sum of all observed images and the last region is determined by directly analyzing the registered target image depicted in FIG. 2.

The parallel excitation system of FIG. 1 is built around a modified Siemens 3T Tim Trio scanner (Siemens Medical Solutions, Erlangen, Germany). The RF coil array is composed of 8 coils whose transmit-receive (TR) elements are tuned to the Larmor frequency at 3T. The coils are overlapped to null mutual inductance between their nearest neighbors. All measurements are performed in a low-dielectric oil phantom that is 17 cm in diameter.

Spatial profiles are obtained using a low flip angle RF pulse sent to one coil at a time with reception occurring on the body coil. This procedure is conducted for each channel independently. $B_1$ maps are generated by recording a complex-valued 3-D image via a gradient-recalled echo (GRE) sequence that is 64×64×64 pixels in size with a resolution of 4-mm, 4-mm and 4-mm in the x, y and z dimensions. The repetition time (TR) and excitation time (TE) of the sequence are 20 ms and 6 ms, respectively, with a bandwidth of 400 Hz per pixel. After collecting the 3-D data cube, its center slice is extracted to yield a 64×64 pixel image with 4-mm resolution in-plane, generating a spatial profile that captures both the magnitude and relative phase of each coil. Spatial variations in the reception profile are not separately characterized and removed because the body coil's profile is very uniform, with less than 5% variation over the region of interest.

For each parallel excitation RF design, the coil array is driven with eight independent channels modulated in magnitude and phase, in the modulators shown in FIG. 1, by the calculated waveform and data is received on the system body coil. The transmit voltage of the RF power amplifiers is set to a value that depends on the acceleration factor and the RF design algorithm in order to maintain flip angles within the small-tip angle assumption and to keep the flip angle essentially constant across all imaging experiments. Readouts are performed using the same 3-D GRE sequence described above, yielding 3-D data cubes 128×128×64 pixels in the x, y and z dimensions with resolutions of 2-mm, 2-mm and 4-mm, respectively. TR and TE equal 30 ms and 6 ms, respectively, and the bandwidth is 400 Hz per pixel. Four averages are performed to improve the SNR. After collecting the 3-D data cube, its center slice is extracted and its magnitude is calculated. These single-slice intensity images are evaluated below.

Figure 5:
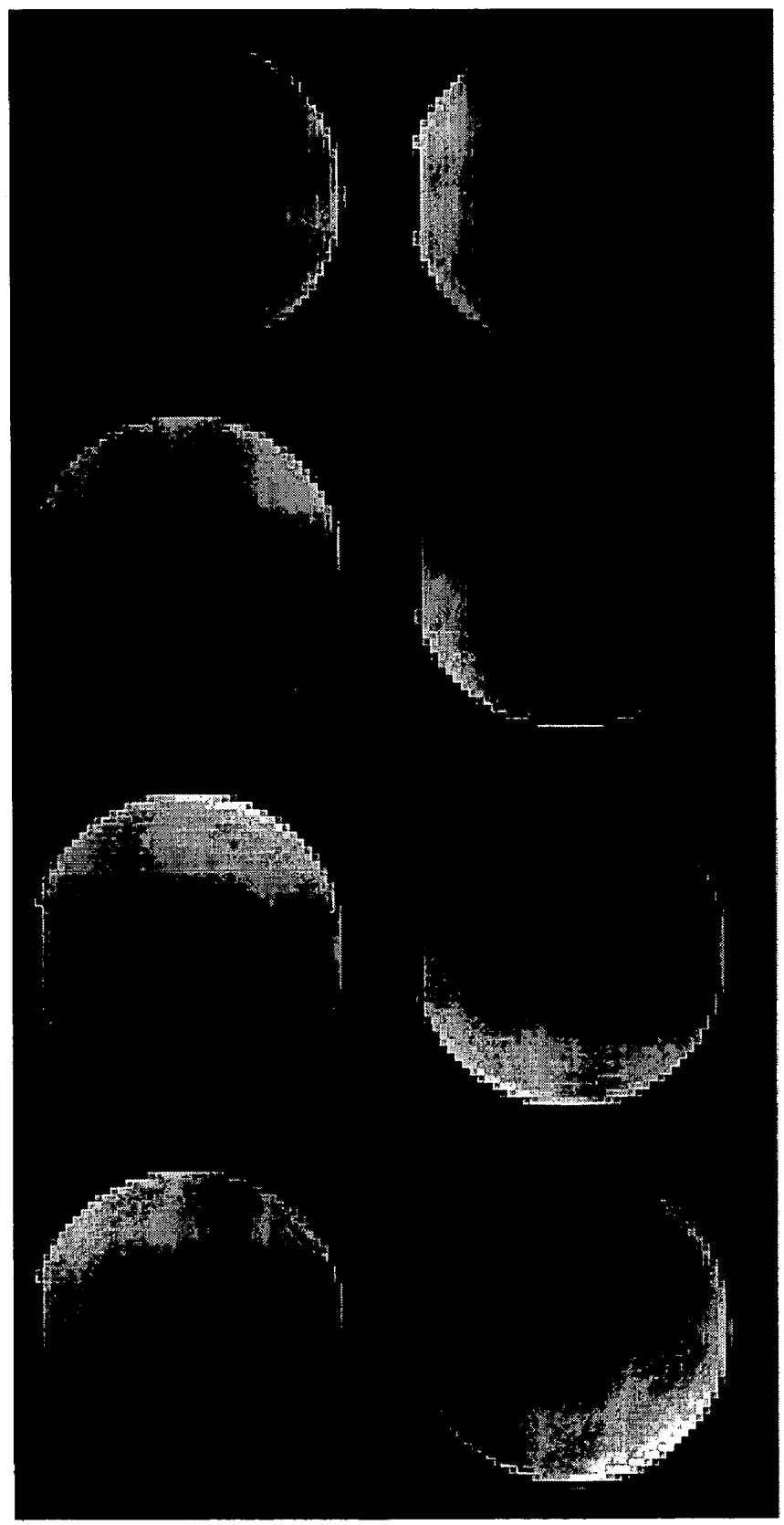
FIG. 5 illustrates $B_1$ maps used in the aforementioned experimental investigations.

The maps were collected as discussed above and truncated down to 51×51 pixels, which maintained the 4-mm resolution in each dimension. This allowed the profiles to match up with the target logo's sizing and pixel resolution. The $B_1$ maps are depicted in FIG. 5. Each map is scaled using the same grayscale color axis, allowing for direct map-to-map comparisons.

For k-space trajectory acceleration factors of 1, 4, 6, and 8, RF waveform designs were generated using each algorithm, leading to 12 designs overall. An image of the target image of FIG. 2 was produced for each design. Since those images are color-coded, they cannot be depicted herein: Each image was an intensity image, 128×128 pixels in size, with 2-mm in-plane resolution. A correlation coefficient was calculated for each image, as explained below. Each image was scaled by a constant such that its noise floor has a mean value equal to 100. This allows fair quantitative (and qualitative) comparisons to be made between the images, especially for each triplet of images in a fixed-acceleration row.

For each of the designs, the peak voltage within the b vector and the root-mean-square (RMS) voltage of its elements are shown in Table I and Table II, respectively. The peak voltages of the waveforms allow a comparison of the peak powers of the designs. The RMS of the N-element vector b is defined as $$\left(\frac{1}{N}\sum_{i=1}^{N} b_i^2\right)^{\frac{1}{2}}.$$

Because RMS is proportional to the average power dissipated by the RF waveform, comparing the RMS values of different b vectors gives an idea of relative power dissipation.

In Table I, the peak voltage of each of the b vectors designed for the experiment is listed. For fixed R, values in parentheses indicate how many times less the LSQR and CGLS peak voltages are compared to the SVD-based method, e.g., for R=6. The peak voltage for CGLS is 1.65 times less than the SVD-based methods. It can be seen that for R>1, designs that used LSQR and CGLS have significantly lower peak voltage values.

| Peak Voltages | SVD | LSQR | CGLS |
|---|---|---|---|
| R = 1 | 1.44 | 1.33 (1.08) | 1.33 (1.08) |
| R = 4 | 5.54 | 5.33 (1.04) | 5.23 (1.06) |
| R = 6 | 40.00 | 24.82 (1.61) | 24.31 (1.65) |
| R = 8 | 95.49 | 85.67 (1.11) | 92.72 (1.03) |

In Table II root mean-square (RMS) voltages of rf waveform designs. The RMS voltage of each of the b vectors designed for the experiment is listed in the table below. For fixed R, values in parentheses indicate how many times less the LSQR and CGLS RMS voltages are compared to the SVD-based method, e.g., for R=8, the RMS voltage for LSQR is 1.41 times less than the SVD-based methods. It can be seem that for R>1. designs that used LSQR and CGLS have significantly lower RMS voltage values.

| RMS Voltages | SVD | LSQR | CGLS |
|---|---|---|---|
| R = 1 | 0.21 | 0.20 (1.05) | 0.20 (1.05) |
| R = 4 | 1.20 | 0.98 (1.22) | 0.97 (1.24) |
| R = 6 | 7.20 | 5.84 (1.23) | 5.73 (1.26) |
| R = 8 | 21.81 | 15.48 (1.41) | 17.02 (1.28) |

Figure 6:
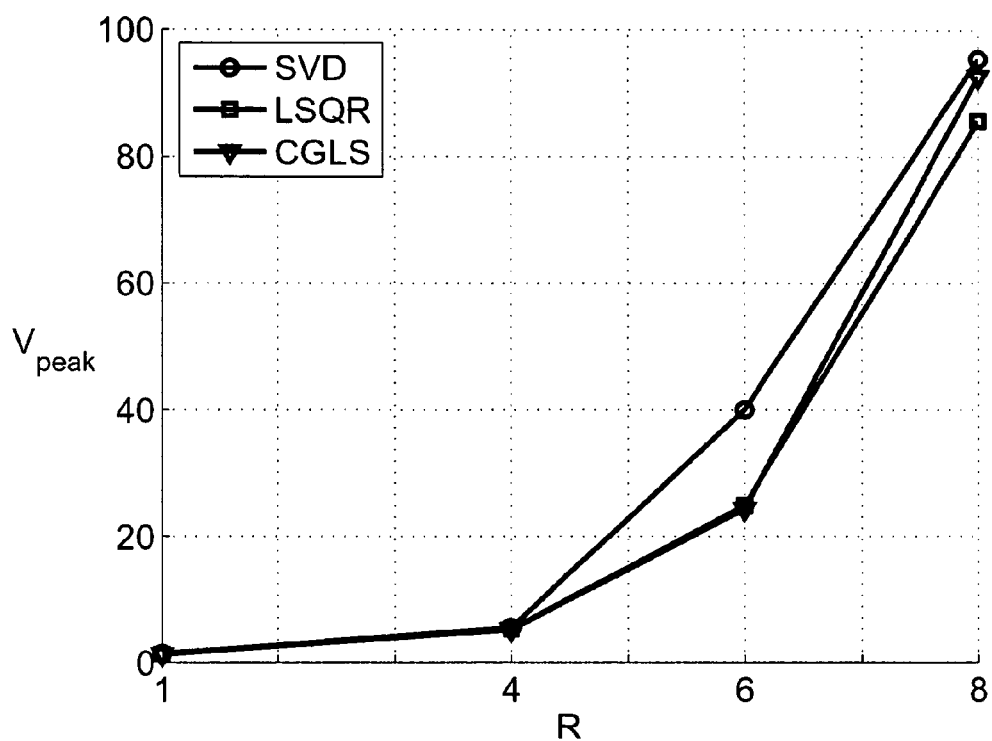
FIG. 6 is a graph showing the peak voltage of each of the b vectors for different acceleration values for waveforms respectively designed according to SVD, LSQR and CGLS algorithms.
Figure 7:
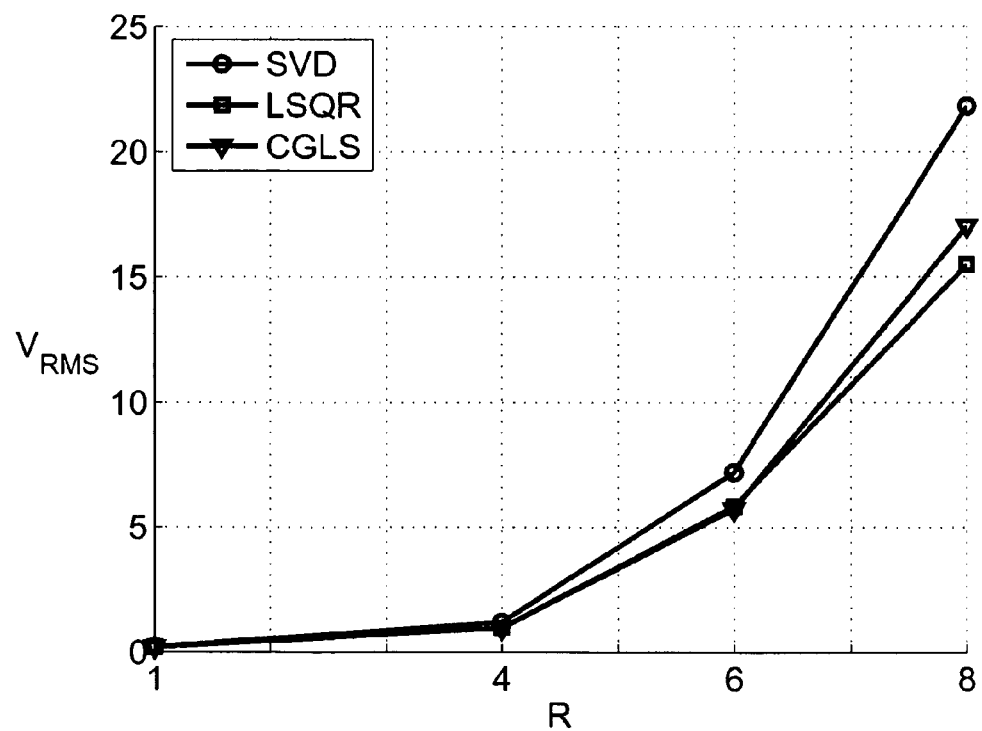
FIG. 7 is a graph showing RMS voltages of b vectors for waveforms respectively designed according to SVD, LSQR and CGLS algorithms.

To better visualize the trends in the voltages, the data in Tables I and II are graphed in FIGS. 6 and 7, respectively.

The aforementioned correlation coefficient between each evaluated image and the registered target image was calculated. Each value was computed over the spatial region designated by Regions 1 through 3, inclusive. These coefficients are set forth below in Table III.

TABLE III

| C (0,T) | SVD | LSQR | CGLS |
|---|---|---|---|
| R = 1 | 0.968 | 0.901) | 0.927 |
| R = 2 | 0.925 | 0.937 | 0.937 |
| R = 3 | 0.896 | 0.913 | 0.914 |
| R = 4 | 0.614 | 0.678 | 0.659 |

The means and standard deviations of each image are illustrated in FIGS. 8A, 8B 8C and 8D. and FIGS. 9A, 9B, 9C and 9D. These statistics were calculated region-by-region. For a fixed region, the data is displayed as a 3-D bar graph. The x and y axis of each plot represent the acceleration factor and algorithm type, respectively. "S", "L" and "C" stand for SVD-based, LSQR and CGLS, respectively. It should be noted that for Region 3, the pixels within the more intense part of the letter "I" were not used for any computations because several pixel values were saturated in some of the images.

It can be seen that the means and standard deviations in Region 0 are equivalent for every image, confirming that all the images do indeed have the same noise floor. More importantly, it can be seen that for R>1, the means of the images in Region 3 are approximately equal, which quantitatively proves that a constant flip angle was achieved across all excitations, e.g., for fixed R, the Region 3 means differ by less than a factor of 1.029, 1.025 and 1.005 for R=4, 6 and 8, respectively.

Each image's peak values are shown in FIG. 10. They were calculated in the same region-by-region manner as the second-order statistics and the labels are analogous. The saturation limitation applied here as well.

Both qualitatively and quantitatively, the LSQR and CGLS designs yield better or equal fidelity excitations than the SVD-based method, which is somewhat surprising, considering that they have lower peak and RMS voltage. Below, each metric is discussed and it relevance to assessing the performance of LSQR and CGLS compared to the SVD-based method.

A qualitative inspection of the evaluated images leads to the conclusion that, for R>1, the excitations due to LSQR and CGLS waveform designs are of equal or higher fidelity than obtained via SVD-based design. In particular, image artifacts in the ring-like edge region (Region 1) are not as prevalent in the LSQR and CGLS images. Another observation is that at higher acceleration factors, artifacts increase, e.g., when transitioning from R=6 to R=8, there is a large jump in artifact levels.

It is clear from the data in Tables I and II and FIGS. 6 and 7 that the LSQR and CGLS designs, in addition to producing higher-fidelity excitations for R>1, have significantly lower peak voltages and RMS voltages. For a fixed value of R, one sees that for less peak voltage and lower RMS, the LSQR and CGLS algorithms yield equal or better quality excitations, which is counter-intuitive. Since the specific absorption rate (SAR) is largely influenced by peak and RMS voltages, we speculate that the SAR values for the LSQR and CGLS RF designs will be significantly lower than those due to the SVD-based technique. In order to fully investigate this hypothesis, it remains necessary to quantify and compare the SAR values in segmented head models caused by each of the three design methods.

A second striking feature of the results in Tables I and II and FIGS. 6 and 7 is the rapid growth in voltage values as a function of R. For instance, in the case of LSQR, the peak voltages increase rapidly, exhibiting a large jump from 5.54 V when R=4 to 40.0 V when R=6. A second large increase occurs for the R=8 trial, which has a peak voltage of 95.49 V. This behavior may pose constraints on in vivo applications; such rapid growth in both peak and RMS voltage seems to imply the infeasibility of R>>1 designs due to algorithm development alone. To push the development of such designs, parallel coil arrays will have to be improved, either to handle higher peak and RMS voltages, or to be more efficient and require less power to produce an excitation.

For a fixed value of R>1, each LSQR and CGLS image exhibited a higher correlation with the target image than the corresponding SVD-based image. This quantitatively shows that the images generated by LSQR and CGLS are a better representation of the target image. Furthermore, as R increases, the correlation coefficients of the SVD-images fall off faster than the LSQR and CGLS ones, implying that the SVD-based algorithm's performance degrades faster than that of LSQR or CGLS.

FIGS. 8A, 8B, 8C and 8D and FIGS. 9A, 9B, 9C and 9D illustrate the region-by-region means and standard deviations of each image, respectively. Ideally, if artifacts were not present, the means and standard deviations throughout Regions 0, 1 and 2 would be equal to those of the background noise, because the original target image has no excitation occurring in these areas. Thus, smaller means and standard deviations throughout these three regions imply that fewer artifacts are present.

In Region 1, the ring-like edge region that is particularly prone to artifacts, it is evident that for fixed R, the LSQR and CGLS images have lower means and standard deviations than the SVD-based images. This same trend occurs in Region 2 as well. For example, in Region 1 for R=6, $(\nu,\sigma)$ for the LSQR and CGLS images equal (206, 126) and (203, 127), respectively, whereas the SVD-based image's second-order statistics equal (260, 175); the SVD-based image's artifacts are significantly larger.

When the lower part of the 'i' is ignored, the target image in Region 3 is uniform. Thus, the smaller $\sigma$ is in this region, the better the observed image matches up to the target. The LSQR and CGLS images have lower standard deviations than the SVD-based images in this region, implying a better fit to the uniformly-valued target pattern. E.g., for R=8, $\sigma$ equals 296, 270 and 265 for the SVD-based, LSQR and CGLS images, respectively. LSQR and CGLS thus fit the uniform target intensity 1.09 and 1.12 times better than does the SVD-based method.

Finally, because the means in Region 3 of all images are approximately equal, this shows that each image achieves the commanded target logo intensity, i.e., the images all achieve the same flip angle.

The peak values per region, illustrated in FIGS. 10A, 10B, 10C and 10D exhibit similar trends to the second-order statistics: in Regions 0 through 2, for a fixed R, peak values for the LSQR and CGLS images are noticeably smaller than those in the SVD-based image. E.g., in Region 2, the suppression region (which ideally should equal zero everywhere), when R=4, the SVD-based method has a peak value of 1935 whereas the LSQR and CGLS images have peaks of 1393 and 1526, respectively.

Some of the collected intensity images exhibited saturation in the lower part of the letter "i". This was due to the limited 12-bit dynamic range of the image format relative to the acquisition parameter settings. To avoid any propagation of errors because of this effect, it was determined to simply leave out the pixels in the lower part of the "i" from the second-order statistics and peak value computations performed on Region 3. It should be noted that in images where no saturation was observed, the intensity level of the "i" was indeed twice that of the other letters. Fortunately, saturation across all other letters and regions was insignificant and the statistics collected in these areas were valid.

The control parameters for the inversion methods were tuned manually to generate b vectors that met the design constraints. This is not a serious limitation in the long run because (a) the user will gain intuition about the parameters and be able to generate designs fairly quickly and (b) for a given choice of parameters, LSQR and CGLS take less than 10 seconds to run on a fairly large systems of equations, so the computational cost of evaluating various parameter combinations is negligible.

As seen from the data and discussion above, LSQR and CGLS perform fairly similarly in terms of each metric. Because of this, either one may be used for waveform design instead of the SVD-based method. LSQR is likely to see more use, however, because it has only one main control parameter and is easier to use than CGLS.

Moving away from conventional SVD-based algorithms to more sophisticated large linear system solvers with favorable numerical properties, namely using LSQR and CGLS for RF waveform design in actual experiments on an 8-channel parallel excitation system on a 3T human scanner, quantitatively demonstrates the superiority of the excitation performance of LSQR and CGLS with respect to the traditional SVD-based algorithm using a variety of image quality metrics.

By simply solving a linear system of equations with algorithms tuned for numeric stability, it is possible to achieve parallel excitation of the same target pattern with less artifacts, lower peak power and lower RMS waveform energy than inversions based on a truncated SVD method. This holds for all trajectory acceleration factors greater than one for measurements conducted using an 8-channel, 3T prototype parallel RF excitation system.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance data from an examination subject comprising the steps of:
    designing a waveform for at least one radio-frequency (RF) pulse for use in a magnetic resonance pulse sequence, by solving a set of linear equations using an algorithm selected from an LSQR algorithm, and a CGLS algorithm; and
    exposing an examination subject to said pulse sequence, including irradiating the subject with at least one RF pulse having said waveform, to acquire magnetic resonance data from the subject in a form capable of reconstruction to generate an image of the subject.

2. A method as claimed in claim 1 comprising solving said set of linear equations using said algorithm to conform said waveform to a target RMS power value.

3. A method as claimed in claim 1 comprising solving said set of linear equations using said algorithm to conform said waveform to a target peak power value.

4. A method as claimed in claim 1 comprising solving said set of equations using said algorithm to achieve a target SAR resulting from irradiation of the subject with said at least one RF pulse.

5. A method as claimed in claim 1 comprising solving said set of linear equations using said algorithm to reduce artifacts in said image.

6. A method as claimed in claim 1 comprising solving said set of linear equations using said algorithm to reduce calculation time for calculating said waveform.

7. A method for acquiring magnetic resonance data from an examination subject comprising the steps of:
    designing a waveform for each of respective radio-frequency (RF) pulses for use in a magnetic resonance pulse sequence, by solving a set of linear equations using an algorithm selected from an LSQR algorithm, and a CGLS algorithm; and
    exposing an examination subject to said pulse sequence, including irradiating the subject with the respective RF pulse having said waveforms individual transmitted from a plurality of transmit channels, to acquire magnetic resonance data from the subject in a form capable of reconstruction to generate an image of the subject.

8. A method as claimed in claim 7 comprising solving said set of linear equations using said algorithm to conform said waveform to a target RMS power value.

9. A method as claimed in claim 7 comprising solving said set of linear equations using said algorithm to conform said waveform to a target peak power value.

10. A method as claimed in claim 7 comprising solving said set of equations using said algorithm to achieve a target SAR resulting from irradiation of the subject with said RF pulses.

11. A method as claimed in claim 7 comprising solving said set of linear equations using said algorithm to reduce artifacts in said image.

12. A method as claimed in claim 7 comprising solving said set of linear equations using said algorithm to reduce calculation time for calculating said waveform.

13. A method for acquiring magnetic resonance data from an examination subject comprising the steps of:
    designing a waveform for each of respective radio-frequency (RF) pulses for use in a magnetic resonance pulse sequence, by solving a set of linear equations using an algorithm selected from an LSQR algorithm, and a CGLS algorithm; and exposing an examination subject to said pulse sequence, including irradiating the subject with said RF pulse having said waveforms for parallel excitation of said subject, to acquire magnetic resonance data from the subject in a form capable of reconstruction to generate an image of the subject.

14. A method as claimed in claim 13 comprising solving said set of linear equations using said algorithm to conform said waveforms to a target RMS power value.

15. A method as claimed in claim 13 comprising solving said set of linear equations using said algorithm to conform said waveforms to a target peak power value.

16. A method as claimed in claim 13 comprising solving said set of equations using said algorithm to achieve a target SAR resulting from irradiation of the subject with said RF pulses.

17. A method as claimed in claim 13 comprising solving said set of linear equations using said algorithm to reduce artifacts in said image.

18. A method as claimed in claim 13 comprising solving said set of linear equations using said algorithm to reduce calculation time for calculating said waveforms.

* * * * *